US011847987B2

(12) United States Patent
Ogawa et al.

(10) Patent No.: US 11,847,987 B2
(45) Date of Patent: *Dec. 19, 2023

(54) DISPLAY DEVICE

(71) Applicant: JAPAN DISPLAY INC., Tokyo (JP)

(72) Inventors: Akihiro Ogawa, Tokyo (JP);
Masanobu Ikeda, Tokyo (JP)

(73) Assignee: Japan Display Inc., Tokyo (JP)

(*) Notice: Subject to any disclaimer, the term of this patent is extended or adjusted under 35 U.S.C. 154(b) by 97 days.

This patent is subject to a terminal disclaimer.

(21) Appl. No.: 17/519,881

(22) Filed: Nov. 5, 2021

(65) Prior Publication Data

US 2022/0059043 A1 Feb. 24, 2022

Related U.S. Application Data

(63) Continuation of application No. PCT/JP2020/017475, filed on Apr. 23, 2020.

(30) Foreign Application Priority Data

May 10, 2019 (JP) .................................. 2019-089975

(51) Int. Cl.
*G09G 3/36* (2006.01)
*G09G 3/34* (2006.01)
(Continued)

(52) U.S. Cl.
CPC ......... *G09G 3/3426* (2013.01); *G02F 1/1336* (2013.01); *G02F 1/133345* (2013.01);
(Continued)

(58) Field of Classification Search
CPC .. G09G 3/3426; G09G 3/3413; G09G 3/3607; G09G 2300/0421;
(Continued)

(56) References Cited

U.S. PATENT DOCUMENTS 6,847,361 B1 * 1/2005 Kitsutaka ................ G06T 15/02
463/31
8,218,860 B1 * 7/2012 Berger .................. H04N 1/6075
382/167
(Continued)

FOREIGN PATENT DOCUMENTS

JP H09212140 A 8/1997
JP 2002196702 A 7/2002
(Continued)

OTHER PUBLICATIONS

International Search Report in Application No. PCT/JP2020/017475, dated Jun. 30, 2020.

*Primary Examiner* — Thuy N Pardo
(74) *Attorney, Agent, or Firm* — K&L Gates LLP

(57) ABSTRACT

A display device includes a plurality of divided pixels each comprising a reflective electrode, a counter electrode provided so as to face the reflective electrode, a color filter provided on a side of the counter electrode opposite to a side of the counter electrode facing the reflective electrode, and a holding unit configured to hold a potential corresponding to an expression of a gradation; and an inorganic light emitter provided on the counter electrode side of the color filter, and configured to emit light.

9 Claims, 12 Drawing Sheets

(51) Int. Cl.
  *G02F 1/1333* (2006.01)
  *G02F 1/13357* (2006.01)
  *H01L 25/075* (2006.01)
  *H01L 33/44* (2010.01)
  *H01L 33/56* (2010.01)
  *G02F 1/1343* (2006.01)
  *G02F 1/1335* (2006.01)

(52) U.S. Cl.
  CPC ..... *G02F 1/133621* (2013.01); *G09G 3/3413* (2013.01); *G09G 3/3607* (2013.01); *H01L 25/0753* (2013.01); *H01L 33/44* (2013.01); *H01L 33/56* (2013.01); *G02F 1/133514* (2013.01); *G02F 1/133553* (2013.01); *G02F 1/133626* (2021.01); *G02F 1/134345* (2021.01); *G02F 1/134372* (2021.01); *G09G 2300/046* (2013.01); *G09G 2300/0421* (2013.01); *G09G 2300/0452* (2013.01)

(58) Field of Classification Search
  CPC ..... G09G 2300/0452; G09G 2300/046; G09G 2300/0857; G09G 3/3648; G02F 1/133345; G02F 1/1336; G02F 1/133621; G02F 1/133514; G02F 1/133553; G02F 1/133626; G02F 1/134345; G02F 1/134372; G02F 1/133616; H01L 25/0753; H01L 33/44; H01L 33/56; H01L 33/58; H01L 33/60; H01L 33/62; G09F 9/46; G09F 9/33
  USPC ............. 345/94, 690; 349/96, 114; 359/296
  See application file for complete search history.

(56) References Cited

U.S. PATENT DOCUMENTS

| | | | | |
|---|---|---|---|---|
| 2009/0278862 A1* | 11/2009 | Shimodaira | .......... | G09G 3/2003 345/690 |
| 2011/0170169 A1* | 7/2011 | Komatsu | ............. | G02F 1/16757 359/296 |
| 2012/0013826 A1* | 1/2012 | Kubo | ................ | G02F 1/133553 349/96 |
| 2014/0125933 A1* | 5/2014 | Tamaki | ................ | G02F 1/1396 349/114 |
| 2015/0002796 A1* | 1/2015 | Fukunaga | ......... | G02F 1/133555 349/106 |
| 2015/0373331 A1* | 12/2015 | Krutsch | ............... | H04N 19/136 382/243 |
| 2016/0260388 A1 | 9/2016 | Yata et al. | | |
| 2017/0124709 A1* | 5/2017 | Rithe | ........................ | G06T 5/40 |
| 2017/0153513 A1* | 6/2017 | Tamaki | ............... | G09G 3/2003 |
| 2017/0179168 A1 | 6/2017 | Suzuki et al. | | |
| 2018/0102271 A1* | 4/2018 | Jinbo | ..................... | H01L 27/153 |
| 2019/0025664 A1* | 1/2019 | Atkinson | ................ | G02F 1/167 |
| 2019/0355928 A1* | 11/2019 | Narutaki | ................ | G02F 1/1335 |
| 2020/0142269 A1* | 5/2020 | Ina | ...................... | G02F 1/13439 |
| 2020/0249509 A1 | 8/2020 | Minoura et al. | | |
| 2020/0363678 A1* | 11/2020 | Yata | .................. | G02F 1/133512 |

FOREIGN PATENT DOCUMENTS

| | | |
|---|---|---|
| JP | 2003076302 A | 3/2003 |
| JP | 2013186294 A | 9/2013 |
| JP | 2016161763 A | 9/2016 |
| JP | 2017111384 A | 6/2017 |
| WO | 2019064575 A1 | 4/2019 |

\* cited by examiner

DISPLAY DEVICE

CROSS-REFERENCE TO RELATED APPLICATION

This application is a continuation of PCT international application No. PCT/JP2020/017475 filed on Apr. 23, 2020, which designates the United States, incorporated herein by reference, and which claims the benefit of priority from Japanese Patent Application No. 2019-089975 filed on May 10, 2019, incorporated herein by reference.

BACKGROUND

1. Technical Field

The present disclosure relates to a display device.

2. Description of the Related Art

A display device for displaying images includes a plurality of pixels. Japanese Patent Application Laid-open Publication No. H9-212140 describes what is called a memory-in-pixel (MIP) display device in which each of a plurality of pixels includes a memory. The MIP display device may be used as a reflective liquid crystal display device that displays images by introducing and reflecting external light such as natural light.

The MIP display device may use area coverage modulation to express a gradation of a color. The term "area coverage modulation" refers to a technology to express a gradation of a color by adjusting the area of display of the color by adjusting the number of pixels for displaying the same color. The MIP display device is provided with a memory for each of the pixels, and also the number of arrangeable pixels is limited. Accordingly, the number of gradations of colors in the MIP display device may be insufficient, so that the number of gradations of colors is desired to be increased.

The present disclosure has been made in view of the above-described problem, and it is an object thereof to provide a MIP display device capable of increasing the number of gradations of colors.

SUMMARY

A display device according to an embodiment of the present disclosure includes a plurality of divided pixels each comprising a reflective electrode, a counter electrode provided so as to face the reflective electrode, a color filter provided on a side of the counter electrode opposite to a side of the counter electrode facing the reflective electrode, and a holding unit configured to hold a potential corresponding to an expression of a gradation, and an inorganic light emitter provided on the counter electrode side of the color filter, and configured to emit light.

DETAILED DESCRIPTION

Figure 1:
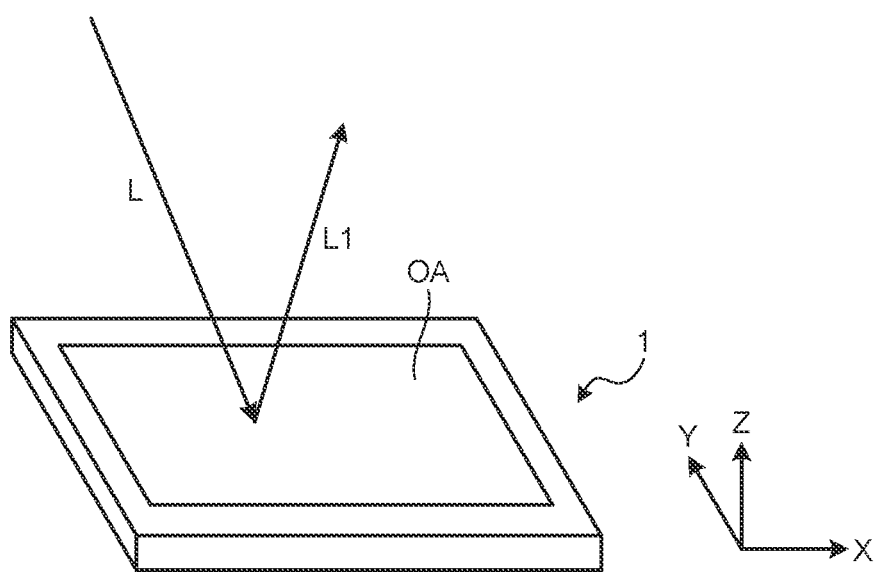
FIG. 1 is a schematic view of a display device according to an embodiment of the present disclosure.

The following describes an embodiment of the present disclosure with reference to the drawings. What is disclosed herein is merely an example, and the present disclosure naturally encompasses appropriate modifications easily conceivable by those skilled in the art while maintaining the gist of the disclosure. To further clarify the description, the drawings schematically illustrate, for example, widths, thicknesses, and shapes of various parts as compared with actual aspects thereof, in some cases. However, they are merely examples, and interpretation of the present disclosure is not limited thereto. The same element as that illustrated in a drawing that has already been discussed is denoted by the same reference numeral through the description and the drawings, and detailed description thereof will not be repeated in some cases where appropriate.

FIG. 1 is a schematic view of a display device according to the present embodiment. As illustrated in FIG. 1, a display device 1 according to the present embodiment is a reflective display device. That is, the display device 1 receives external light L in a display region OA, and reflects and emits the received external light L as light L1 to display an image. Moreover, the display device 1 is what is called a memory-in-pixel (MIP) display device in which each of a plurality of pixels includes a memory. Hereinafter, a direction X denotes one direction parallel to the display region OA, and a direction Y denotes one direction parallel to the display region and orthogonal to the direction X. A direction Z denotes a direction orthogonal to the display region, that is, a direction orthogonal to the direction X and the direction Y.

Figure 2:
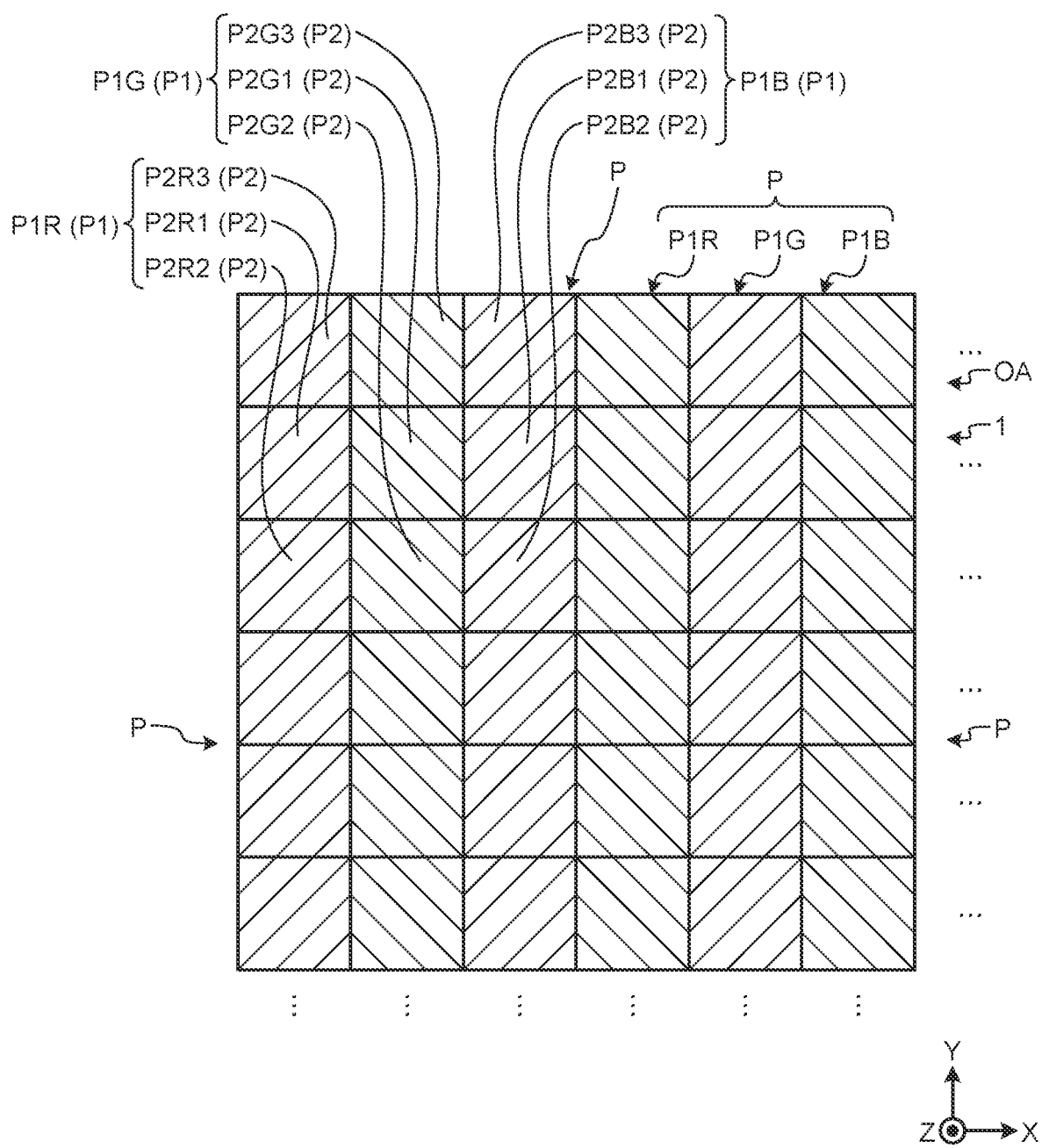
FIG. 2 is a schematic diagram illustrating an exemplary pixel array according to the embodiment.

FIG. 2 is a schematic diagram illustrating an exemplary pixel array according to the present embodiment. The display device 1 is provided with a pixel P for expressing a color in the display region OA. A plurality of the pixels P are provided, and are arranged in a matrix having a row-column configuration in the direction X and the direction Y. The pixel P includes a plurality of sub-pixels P1. The sub-pixels P1 in each of the pixels P display colors different from one another. In the present embodiment, the pixel P includes sub-pixels P1R, P1G, and P1B as three of the sub-pixels P1. The sub-pixel P1R is a sub-pixel for displaying red as a primary color in the present embodiment. The sub-pixel P1G is a sub-pixel for displaying green as a primary color in the present embodiment. The sub-pixel P1B is a sub-pixel for displaying blue as a primary color in the present embodiment. However, the colors displayed by the respective sub-pixels P1 are not limited to red, green, and blue as the primary colors. In the example of FIG. 2, the sub-pixels P1R, P1G, and P1B are arranged along the direction X to form a stripe-shaped sub-pixel array in each of the pixels P. However, the sub-pixel array is not limited to the stripe-shaped array.

Each of the sub-pixels P1 includes a plurality of divided pixels P2. The divided pixels P2 included in each of the sub-pixels P1 display the same color as one another. In the example of FIG. 2, each of the sub-pixels P1 includes three of the divided pixels P2. Specifically, the sub-pixel P1R includes divided pixels P2R1, P2R2, and P2R3 each for displaying red as the primary color. The sub-pixel P1G includes divided pixels P2G1, P2G2, and P2G3 each for displaying green as the primary color. The sub-pixel P1B includes divided pixels P2B1, P2B2, and P2B3 each for displaying blue as the primary color. However, the number of the divided pixels P2 included in each of the sub-pixels P1 is not limited to three, and may be any number. In addition, the colors displayed by the respective divided pixels P2 are not limited to red, green, and blue as the primary colors. In the example of FIG. 2, the divided pixels P2 are arranged along the direction Y to serve as a divided pixel array in each of the sub-pixels P1. However, the divided pixel array is not limited to being arranged along the direction Y.

The display device 1 includes the divided pixels P2 in this manner, and drives each of the divided pixels P2 to express gradations of the pixels P by performing area coverage modulation. The term "gradation" refers to a value representing a color density in a stepwise manner. The color density can be expressed more smoothly as the number of gradation values is larger. The area coverage modulation will be described later.

Figure 3:
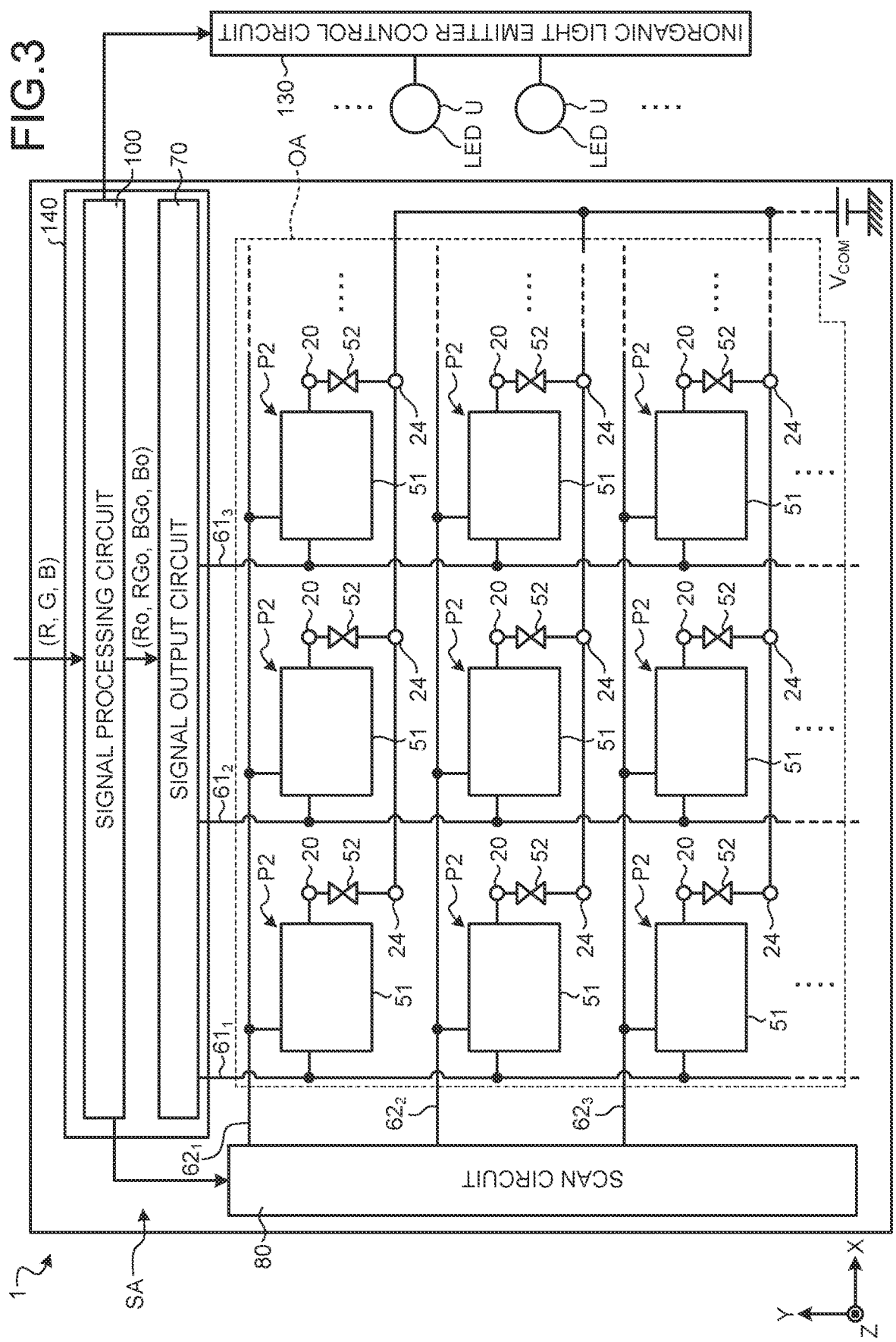
FIG. 3 is a diagram illustrating a circuit configuration example of the display device according to the embodiment.

The following describes a circuit configuration of the display device 1 according to the present embodiment. FIG. 3 is a diagram illustrating a circuit configuration example of the display device according to the present embodiment. As illustrated in FIG. 3, the display device 1 includes the pixels P, that is, the divided pixels P2 and a plurality of inorganic light emitters U. Each of the inorganic light emitters U includes an inorganic light emitting element LED. The inorganic light emitting element LED is an inorganic light-emitting diode (LED) chip having a size of, for example, approximately 3 μm to 300 μm in a plan view, and is called a micro LED. The display device 1 provided with the micro LED in each of the pixels is also called a micro LED display device. The term "micro" of the micro LED does not limit the size of the inorganic light emitting element LED. For convenience of explanation, FIG. 3 illustrates the inorganic light emitters U as being provided on a direction X side of the divided pixels P2. However, the actual positions of the inorganic light emitters U are not limited to those illustrated in FIG. 3. The positions where the inorganic light emitters U and the inorganic light emitting elements LED are provided will be described later.

The divided pixel P2 includes, for example, a circuit unit 51, a reflective electrode 20, and a counter electrode 24. The circuit unit 51 is electrically coupled to scan lines 62 ($62_1$, $62_2$, $62_3$, . . . ) and signal lines 61 ($61_1$, $61_2$, $61_3$, . . . ). The circuit unit 51 includes at least a drive circuit unit 58 (to be described later).

The reflective electrode 20 is provided for each of the divided pixels P2, and is coupled to the circuit unit 51. The counter electrode 24 is provided so as to face one, a plurality, or all of the reflective electrodes 20. A liquid crystal capacity 52 is a capacity component of a liquid crystal material generated between the reflective electrode 20 and the counter electrode 24.

The divided pixels P2 are provided in intersection positions between the signal lines 61 and the scan lines 62 in the display region OA. One ends of the signal lines 61 ($61_1$, $61_2$, $61_3$, . . . ) are coupled to output ends corresponding to respective columns of a signal output circuit 70. One ends of the scan lines 62 ($62_1$, $62_2$, $62_3$, . . . ) are coupled to output ends corresponding to respective rows of a scan circuit 80. The signal lines 61 ($61_1$, $61_2$, $61_3$, . . . ) are wiring for transmitting signals for driving the divided pixels P2, that is, video signals output from the signal output circuit 70 to the divided pixels P2 on a pixel column-by-pixel column basis. The scan lines 62 ($62_1$, $62_2$, $62_3$, . . . ) are wiring for transmitting signals for selecting the divided pixels P2 on a row-by-row basis, that is, scan signals output from the scan circuit 80 on a pixel row-by-pixel row basis.

The display device 1 includes the signal output circuit 70, the scan circuit 80, a signal processing circuit 100, and an inorganic light emitter control circuit 130. The signal output circuit 70 and the scan circuit 80 are circuits for driving the divided pixels P2. The inorganic light emitter control circuit 130 is a circuit for driving the inorganic light emitters U. The signal output circuit 70, the scan circuit 80, and the inorganic light emitter control circuit 130 are coupled to the signal processing circuit 100. The signal processing circuit 100 calculates a gradation value of each of the sub-pixels P1 included in each of the pixels P based on received gradation values. The signal processing circuit 100 outputs the calculation result of the gradation value as an area coverage modulation signal of each of the pixels P to the signal output circuit 70, and outputs the calculation result as a gradation signal of the inorganic light emitter control circuit 130 to the inorganic light emitter control circuit 130. The signal output circuit 70 outputs the video signal including the area coverage modulation signal to each of the divided pixels P2. The inorganic light emitter control circuit 130 outputs a light emission control signal based on the gradation signal to each of the inorganic light emitters U. The signal processing circuit 100 outputs a clock signal for synchronizing operations of the signal output circuit 70, the scan circuit 80, and the inorganic light emitter control circuit 130 to the signal output circuit 70, the scan circuit 80, and the inorganic light emitter control circuit 130. The signal output circuit 70 and the inorganic light emitter control circuit 130 output the video signal and the light emission control signal in synchronization with each other, and the scan circuit 80 scans the divided pixels P2 in synchronization with the video signal from the signal output circuit 70 and the light emission control signal from the inorganic light emitter control circuit 130. The inorganic light emitter control circuit 130 drives the inorganic light emitters U in synchronization with the divided pixels P2 as described above. The inorganic light emitter control circuit 130 may drive the inorganic light emitters U by performing analog driving, driving using a pulse width modulation (PWM) method, or a combination of the analog driving and the driving using the PWM method.

The signal output circuit 70 and the signal processing circuit 100 may be included in one integrated circuit (IC) chip 140, or a configuration may be employed in which the signal output circuit 70 and the signal processing circuit 100 are individual circuit chips. The inorganic light emitter control circuit 130 may be mounted on the IC chip 140. In FIG. 3, a circuit chip such as the IC chip 140 is provided in a peripheral region SA of the display device 1 using a chip-on-glass (COG) technique. However, this is merely an example of mounting of the circuit chip, and the present disclosure is not limited thereto. The circuit chip may be provided, for example, on a flexible printed circuit (FPC) coupled to the display device 1, using a chip-on-film (COF) technique.

Figure 4:
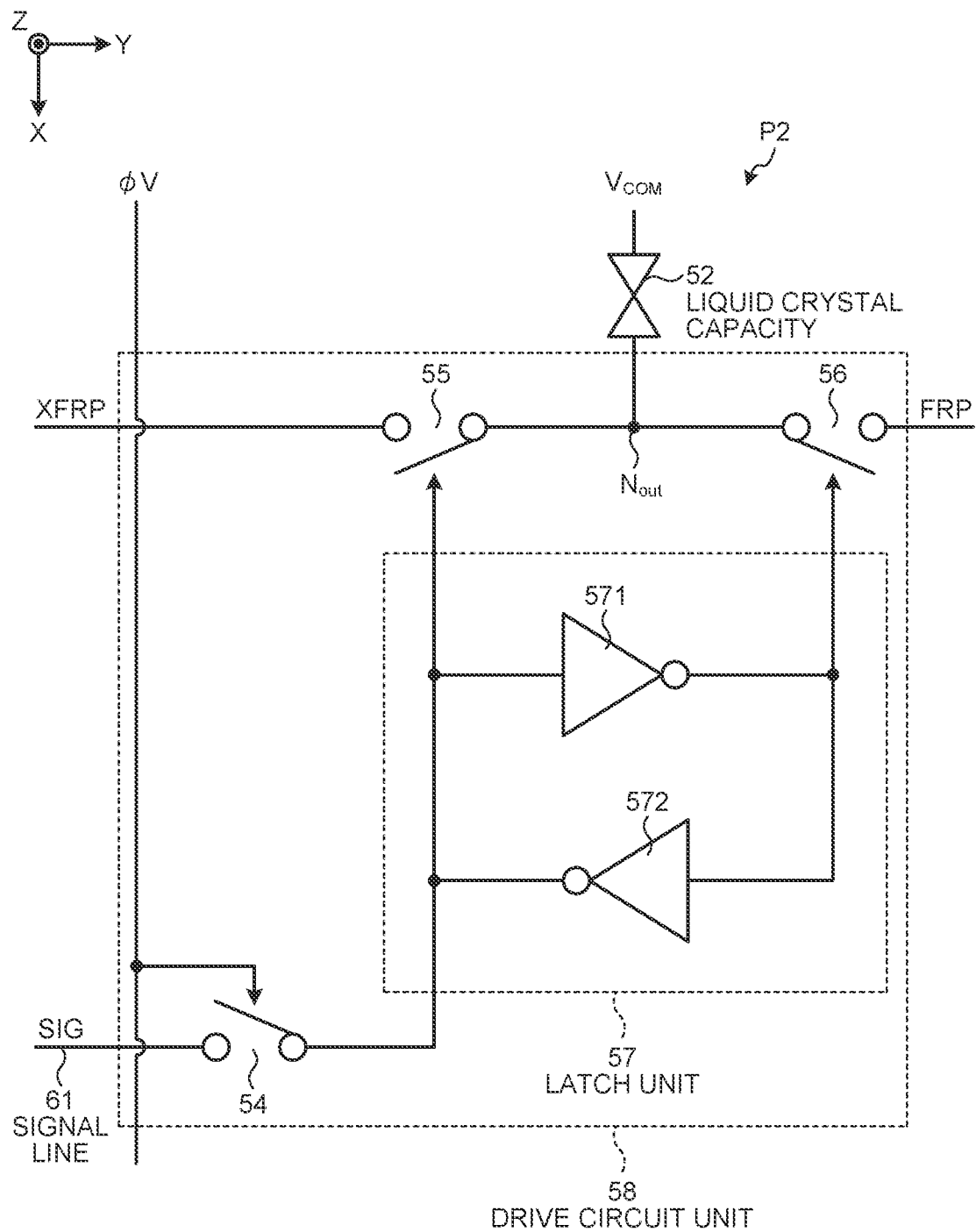
FIG. 4 is a block diagram illustrating an exemplary circuit configuration of a divided pixel according to the embodiment.
Figure 5:
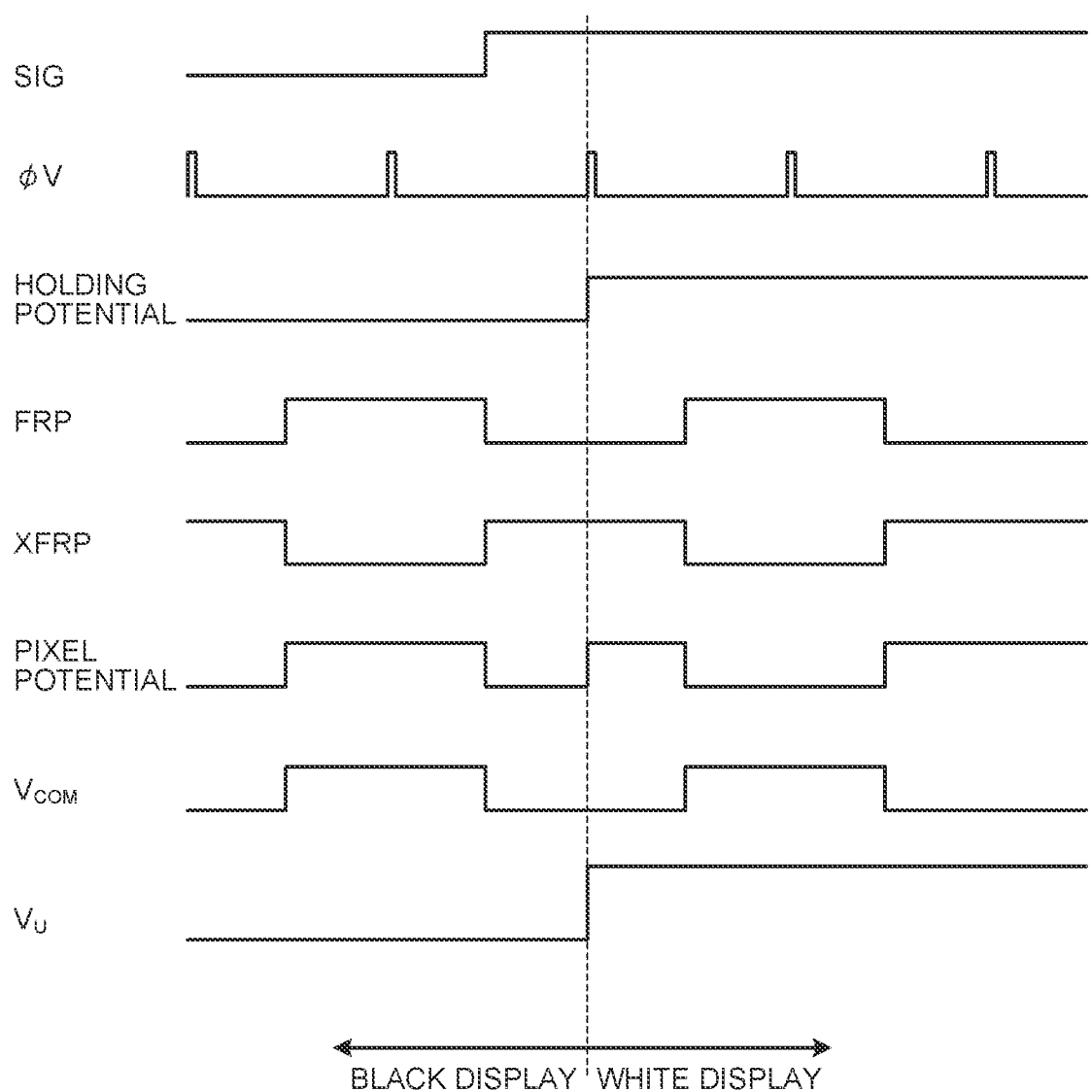
FIG. 5 is a timing diagram used for describing an operation of the divided pixel according to the embodiment.

FIG. 4 is a block diagram illustrating an exemplary circuit configuration of the divided pixel according to the present embodiment. FIG. 5 is a timing diagram used for describing operation of the divided pixel according to the present embodiment. As illustrated in FIG. 4, the divided pixel P2 includes, as the circuit unit 51, the drive circuit unit 58 including three switching elements 54, 55, and 56 and a latch unit 57, in addition to the liquid crystal capacity (liquid crystal cell) 52. The drive circuit unit 58 has a static random-access memory (SRAM) function. The divided pixel P2 including the drive circuit unit 58 has a pixel configuration having the SRAM function.

One end of the switching element 54 is coupled to one of the signal lines 61. The switching element 54 is placed in an on (closed) state by being supplied with a scan signal pV (refer to FIG. 5) from the scan circuit 80, and takes in data SIG supplied from the signal output circuit 70 through the signal lines 61. The latch unit 57 includes inverters 571 and 572 coupled in parallel toward opposite directions to each other, and holds (latches) a potential corresponding to the data SIG taken in by the switching element 54.

Terminals on one sides of the switching elements 55 and 56 are supplied with a control pulse XFRP having a phase reversed from that of a common potential $V_{COM}$ and a control pulse FRP having the same phase as that of the common potential $V_{COM}$ (refer to FIG. 5). Terminals on the other sides of the switching elements 55 and 56 are commonly coupled, and a common coupling node therebetween serves as an output node $N_{out}$. One of the switching elements 55 and 56 is placed in the on state according to a polarity of a holding potential of the latch unit 57. Through the above-described operation, the control pulse FRP or the control pulse XFRP is applied through the reflective electrode 20 to the liquid crystal capacity 52 to which the common potential $V_{COM}$ is applied through the counter electrode 24.

When the holding potential of the latch unit 57 has a negative polarity, the pixel potential of the liquid crystal capacity 52 has the same phase as that of the common potential $V_{COM}$, so that no potential difference is generated between the reflective electrode 20 and the counter electrode 24. Therefore, no electric field is generated in a liquid crystal layer 18 (refer to FIG. 6). Accordingly, in this case, liquid crystal molecules do not twist from an initial orientation state, and are kept in a normally black state. As a result, such divided pixels P2 do not transmit light. In contrast, when the holding potential of the latch unit 57 has a positive polarity, the pixel potential of the liquid crystal capacity 52 has a phase reversed from that of the common potential $V_{COM}$, so that a potential difference is generated between the reflective electrode 20 and the counter electrode 24, and thus, an electric field is generated in the liquid crystal layer 18. Such an electric field twists the liquid crystal molecules to change the orientation thereof from the initial orientation state. As a result, the divided pixels P2 transmit light (transmission state). As described above, the display device 1 is provided with a holding unit (latch unit 57) for holding the potential corresponding to the gradation expression in each of the divided pixels P2.

In each of the divided pixels P2, one of the switching elements 55 and 56 is placed in the on state according to the polarity of the holding potential of the latch unit 57 so as to apply the control pulse FRP or the control pulse XFRP to the reflective electrode 20 of the liquid crystal capacity 52. This operation controls the on and off of the light transmission of the divided pixel P2.

In each of the divided pixels P2, one of the switching elements 55 and 56 is placed in the on state according to the polarity of the holding potential of the latch unit 57 so as to apply the control pulse FRP or the control pulse XFRP to the reflective electrode 20 of the liquid crystal capacity 52. This operation controls the on and off of the light transmission of the divided pixel P2. In this example, the case has been described as an example where the SRAM formed in the latch circuit is used as the memory embedded in the divided pixel P2. However, the SRAM is merely an example, and a configuration may be employed in which another memory, such as a dynamic random-access memory (DRAM) formed of one transistor and one capacitor, is used.

In the present embodiment, as illustrated in FIG. 5, for example, when the pixel P expresses a predetermined gradation value such as that for white display, a potential VU is applied from the inorganic light emitter control circuit 130 to the inorganic light emitter U to drive (illuminate) the inorganic light emitting element LED of the inorganic light emitter U.

Figure 6:
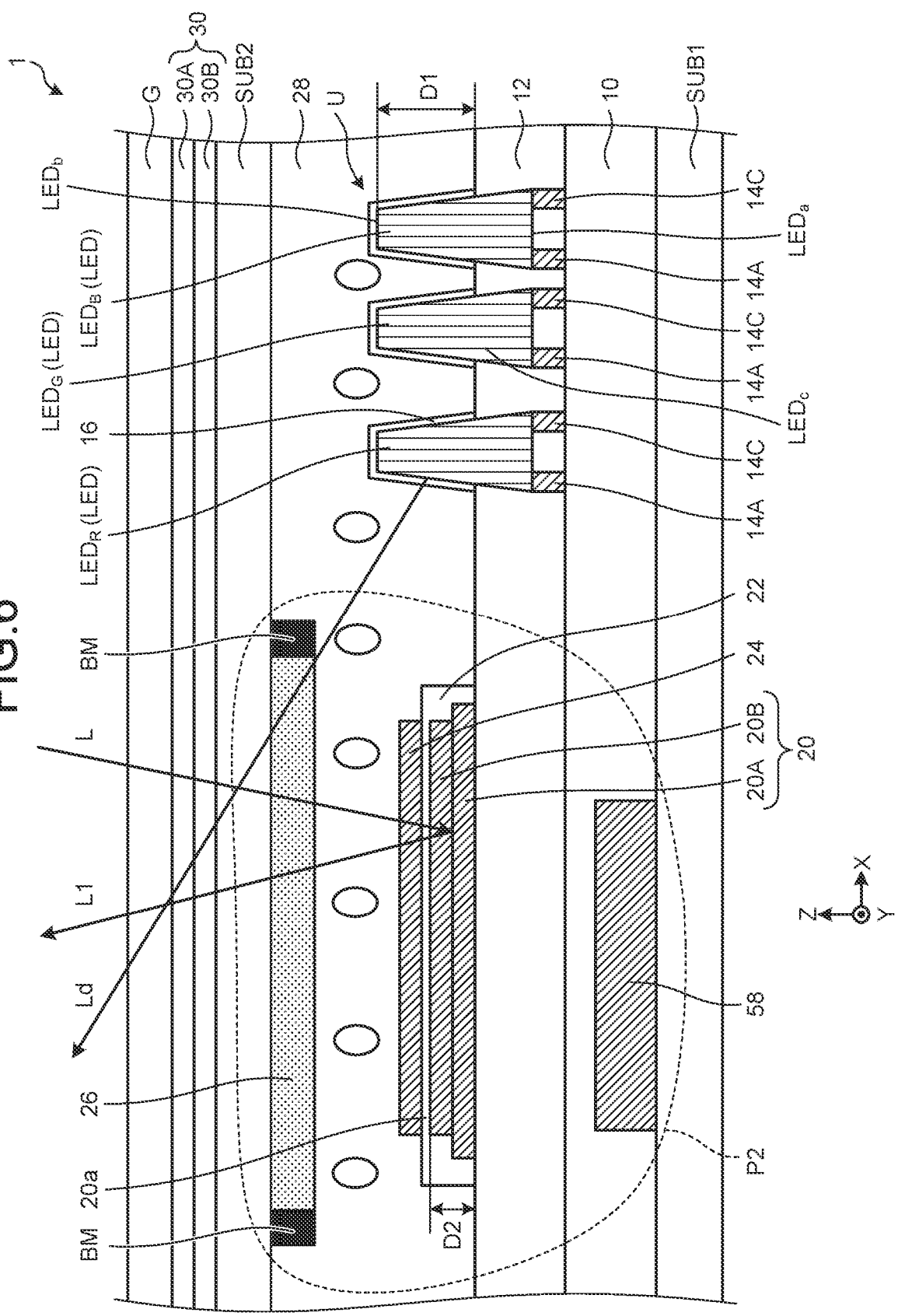
FIG. 6 is a schematic sectional view of the display device according to the embodiment.

The following describes a multilayered structure of the display device 1. FIG. 6 is a schematic sectional view of the display device according to the present embodiment. As illustrated in FIG. 6, the display device 1 is provided with a substrate SUB1 and a substrate SUB2 facing each other in the direction Z. Hereinafter, a side in the direction Z from the substrate SUB1 toward the substrate SUB2 is called an "upper side", and a side in the direction Z from the substrate SUB2 toward the substrate SUB1 is called a "lower side".

The substrate SUB1 is, for example, a glass substrate. The upper side of the substrate SUB1 is provided with the drive circuit unit 58 including, for example, the latch unit 57, and with insulating layers 10 and 12, the reflective electrode 20, an insulating layer 22, the counter electrode 24, an anode electrode 14A, a cathode electrode 14C, and each of the inorganic light emitters U. The drive circuit unit 58 including, for example, the latch unit 57 is stacked on a surface on the upper side of the substrate SUB1. The drive circuit unit 58 is provided for each of the divided pixels P2. The surface on the upper side of the substrate SUB1 may be provided with wiring such as the signal lines 61 and electrodes, in addition to the drive circuit unit 58. The insulating layer 10 is stacked on the upper side of the drive circuit unit 58. The insulating layer 12 is stacked on the upper side of the insulating layer 10. Each of the insulating layers 10 and 12 is a layer formed of a light-transmitting insulating member, and is formed of, for example, a resin. The reflective electrode 20 is provided on the upper side of the insulating layer 12. That is, the reflective electrode 20 is an electrode that reflects light, and is a film-like electrode formed on a surface on the upper side of the insulating layer 12. The reflective electrode 20 is provided for each of the divided pixels P2. The reflective electrode 20 and the drive circuit unit 58 are coupled to each other through, for example, a through-hole provided in the insulating layer 10. In the present embodiment, the reflective electrode 20 includes a reflective portion 20A and a light-transmitting portion 20B. The reflective portion 20A is formed of a member capable of reflecting light, and is, for example, a thin-film metal electrode of, for example, silver (Ag) or aluminum (Al). The light-transmitting portion 20B is provided on a surface on the upper side of the reflective portion 20A, and is an electrode formed of a member capable of transmitting light. The light-transmitting portion 20B is formed of, for example, indium tin oxide (ITO). However, the reflective electrode 20 is not limited to being constituted by the reflective portion 20A and the light-transmitting portion 20B, and may be constituted by, for example, only an electrode formed of a member capable of reflecting light without including the light-transmitting portion 20B.

The insulating layer 22 is provided on the upper side of the reflective electrode 20. The insulating layer 22 is a layer formed of a light-transmitting insulating member, and is formed of, for example, a resin. The counter electrode 24 is provided on the upper side of the insulating layer 22. That is, the counter electrode 24 is a film-like electrode formed on a surface on the upper side of the insulating layer 22. The counter electrode 24 is an electrode that transmits light (light-transmitting electrode) formed using, for example, ITO. The counter electrode 24 faces the reflective electrode 20 with the insulating layer 22 interposed therebetween in the direction Z. The counter electrode 24 may be provided for each of the divided pixels P2, that is, for each of the reflective electrodes 20, or may be commonly provided for the divided pixels P2 (reflective electrodes 20).

The anode electrode 14A and the cathode electrode 14C are provided on a surface on the upper side of the insulating layer 10. The anode electrode 14A is an electrode on an anode side of the inorganic light emitting element LED, and is coupled to wiring provided on the substrate SUB1 through, for example, a through-hole provided in the insulating layer 10, and is coupled to the inorganic light emitter control circuit 130 through the wiring. The cathode electrode 14C is an electrode on a cathode side of the inorganic light emitting element LED, and is coupled to wiring provided on the substrate SUB1 through, for example, a through-hole provided in the insulating layer 10, and is coupled to the inorganic light emitter control circuit 130 through the wiring.

The inorganic light emitter U is provided on surfaces on the upper sides of the anode electrode 14A and the cathode electrode 14C. The inorganic light emitter U includes the inorganic light emitting elements LED. The inorganic light emitting element LED of the inorganic light emitter U has a lower surface LEDa on the upper sides of the anode electrode 14A and the cathode electrode 14C, and is coupled on the surface LEDa to the anode electrode 14A and the cathode electrode 14C. That is, the inorganic light emitting element LED according to the present embodiment has a flip chip structure that is coupled to the electrodes on one surface. An upper surface LEDb of the inorganic light emitting element LED projects to the upper side of the insulating layer 12. That is, the inorganic light emitting element LED is provided in the insulating layer 12 from the lower surface LEDa to a portion LEDc serving as a portion between the surface LEDa and the surface LEDb, and is exposed to the upper side of the insulating layer 12 from the portion LEDc to the upper surface LEDb. A liquid crystal layer 28 (to be described later) is provided on the upper side of the insulating layer 12. Therefore, the portion from the portion LEDc to the upper surface LEDb can be said to be provided in the liquid crystal layer 28. The inorganic light emitting element LED can be said to be at least partially provided in the liquid crystal layer 28.

Herein, a length D1 denotes a length in the direction Z from the surface on the upper side of the insulating layer 12 to the upper surface LEDb of the inorganic light emitting element LED, and a length D2 denotes a length in the direction Z from the surface on the upper side of the insulating layer 12 to an upper surface 20a of the reflective electrode 20. In this case, the length D1 is preferably larger than the length D2. That is, the surface LEDb on the upper side of the insulating layer 12 is preferably located on the upper side (on a color filter 26 side (to be described later)) of the upper surface 20a of the reflective electrode 20. The upper surface LEDb of the inorganic light emitting element LED is preferably located on the lower side (reflective electrode 20 side) of a surface on the lower side of the color filter 26 (to be described later). That is, the inorganic light emitter U (inorganic light emitting element LED) is provided on the lower side (on the counter electrode 24 side) of the color filter 26.

A protective film 16 covers the portion of the inorganic light emitting element LED exposed from the insulating layer 12 (portion provided in the liquid crystal layer 18), that is, the portion from the portion LEDc to the upper surface LEDb of the inorganic light emitting element LED. The protective film 16 is a light-transmitting film. For example, an insulating film of, for example, a Ga oxide, $SiO_2$, SiN, or $Al_2O_3$, or a metal oxide film of, for example, ITO or ZnO may be used as the protective film 16. The refractive index of light in the protective film 16 is preferably higher than that of light in the insulating layer 12, and lower than that of light in the material constituting the inorganic light emitting element LED. By providing the protective film 16, the inorganic light emitting element LED is restrained from contacting the liquid crystal layer 28.

As described above, the inorganic light emitting element LED is provided in the same layer as that of the reflective electrode 20 (herein, on the insulating layer 12). The inorganic light emitting element LED emits light upward, that is, toward the color filter 26 (to be described later).

In the example of FIG. 6, the inorganic light emitter U includes three inorganic light emitting elements $LED_R$, $LED_G$, and $LED_B$ as the inorganic light emitting elements LED. The inorganic light emitting element $LED_R$ emits light in the same color as the color displayed by the sub-pixel P1R (color of the light transmitted through the color filters 26 of the divided pixels P2R1, P2R2, and P2R3), that is, herein, emits red light. The inorganic light emitting element $LED_G$ emits light in the same color as the color displayed by the sub-pixel P1G (color of the light transmitted through the color filters 26 of the divided pixels P2G1, P2G2, and P2G3), that is, herein, emits green light. The inorganic light emitting element $LED_B$ emits light in the same color as the color displayed by the sub-pixel P1B (color of the light transmitted through the color filters 26 of the divided pixels P2B1, P2B2, and P2B3), that is, herein, emits blue light. As described above, the inorganic light emitter U according to the present embodiment includes the inorganic light emitting elements LED that emit the light in the same colors as those of the respective sub-pixels P1 (divided pixels P2) in each of the pixels P. However, the colors emitted by the inorganic light emitting elements LED included in the inorganic light emitter U may be any colors, and the number of the inorganic light emitting elements LED included in the inorganic light emitter U may also be any number. For example, the number of the inorganic light emitting elements LED for emitting the same color may be two or larger.

The substrate SUB2 is, for example, a glass substrate, and transmits light. A color filter 26 and a black matrix BM are provided on the lower side of the substrate SUB2. The color filter 26 is stacked on a surface on the lower side of the substrate SUB2. The color filter 26 is a filter for transmitting light in a predetermined waveband of visible light. The color filter 26 is provided for each of the divided pixels P2. For example, each of the divided pixels P2R1, P2R2, and P2R3 is provided with the color filter 26 for transmitting light in a red waveband; each of the divided pixels P2G1, P2G2, and P2G3 is provided with the color filter 26 for transmitting light in a green waveband; and each of the divided pixels P2B1, P2B2, and P2B3 is provided with the color filter 26 for transmitting light in a blue waveband. That is, the divided pixels P2 included in each of the sub-pixels P1 are provided with the color filters 26 for transmitting light in the same waveband. The black matrix BM is provided between the color filters 26. That is, the black matrix BM is provided between the color filters 26 of the adjacent divided pixels P2.

The liquid crystal layer 28 is provided between the substrate SUB2 and the insulating layer 12 in the direction Z. Accordingly, the color filter 26, the counter electrode 24, the insulating layer 22, and the inorganic light emitter U can be said to be provided in the liquid crystal layer 28. The liquid crystal layer 28 can also be said to be provided between the color filter 26 and the counter electrode 24. The liquid crystal layer 28 is sealed with a sealing material, which is not illustrated. The sealing material performs the sealing by bonding together lateral sides of the substrate SUB1 and the substrate SUB2. The distance between the substrate SUB2 and the insulating layer 12 is determined by a spacer, which is not illustrated. The initial orientation state of the liquid crystal molecules of the liquid crystal layer 28 is determined by orientation films (not illustrated) provided on the substrate SUB1 and the substrate SUB2. The liquid crystal molecules do not transmit light in the initial orientation state. The term "normally black state" refers to the state of not transmitting light in the initial orientation state of not applying the electric field to the liquid crystal layer 28 as described above.

Each of the divided pixels P2 is constituted by the reflective electrode 20, the counter electrode 24, the liquid crystal layer 18, the color filter 26, and the drive circuit unit 58 (latch unit 57) that are stacked as described above.

The display device 1 is provided with a dimming layer 30 and a cover portion G on the upper side of the substrate SUB2. The dimming layer 30 includes, for example, a polarizing plate 30A provided on the upper side and a scattering layer 30B provided between the polarizing plate 30A and the substrate SUB2. The polarizing plate 30A transmits light polarized in a particular direction. The scattering layer 30B scatters the light L1 reflected by the reflective electrode 20. However, the dimming layer 30 is not an essential component, and need not be provided. The cover portion G is a cover provided on the upper side of the dimming layer 30, and constitutes a surface in the display region OA of the display device 1. The cover portion G is formed of a light-transmitting member, and is, for example, a member made of glass or a resin.

The display device 1 has the multilayered structure as described above. Accordingly, when the liquid crystal molecules of the liquid crystal layer 18 are in the state of transmitting the light, the external light L is emitted to the reflective portion 20A of the reflective electrode 20 through the cover portion G, the dimming layer 30, the substrate SUB2, the color filter 26, the liquid crystal layer 18, the counter electrode 24, and the insulating layer 22. The reflective portion 20A reflects the emitted external light L to emit outward the light L1 serving as reflected light through the insulating layer 22, the counter electrode 24, the liquid crystal layer 18, the color filter 26, the substrate SUB2, the dimming layer 30, and the cover portion G. Light La emitted by the inorganic light emitting element LED is emitted outward through the liquid crystal layer 18, the color filter 26, the substrate SUB2, the dimming layer 30, and the cover portion G. Accordingly, the light La from the inorganic light emitting element LED is combined with the light L1 from the reflective electrode 20, and thus, the intensity of light emitted from the display device 1 increases. As will be described later, the light La from the inorganic light emitting element LED can increase the number of gradations of the divided pixel P2. While the inorganic light emitting element LED emits the light La to the color filter 26 without transmitting the light La through the reflective electrode 20, the inorganic light emitting element LED may emit at least a portion of the light La to the reflective electrode 20 to deliver the light La to the color filter 26 via the reflective electrode 20 (by reflecting the light La on the reflective electrode 20).

In the example of FIG. 6, the display device 1 has a multilayered structure in a horizontal electric field mode, such as an in-plane switching (IPS) mode including fringe field switching (FFS), in which the reflective electrode 20 and the counter electrode 24 are provided on the lower side of the liquid crystal layer 28. However, the display device 1 is not limited to the horizontal electric field mode, and may have a multilayered structure having a vertical electric field system. In the case of the vertical electric field system, the reflective electrode 20 is provided on the lower side of the liquid crystal layer 28; the counter electrode 24 is provided on the upper side of the liquid crystal layer 28; and the reflective electrode 20 faces the counter electrode 24 with the liquid crystal layer 28 interposed therebetween.

Figure 7:
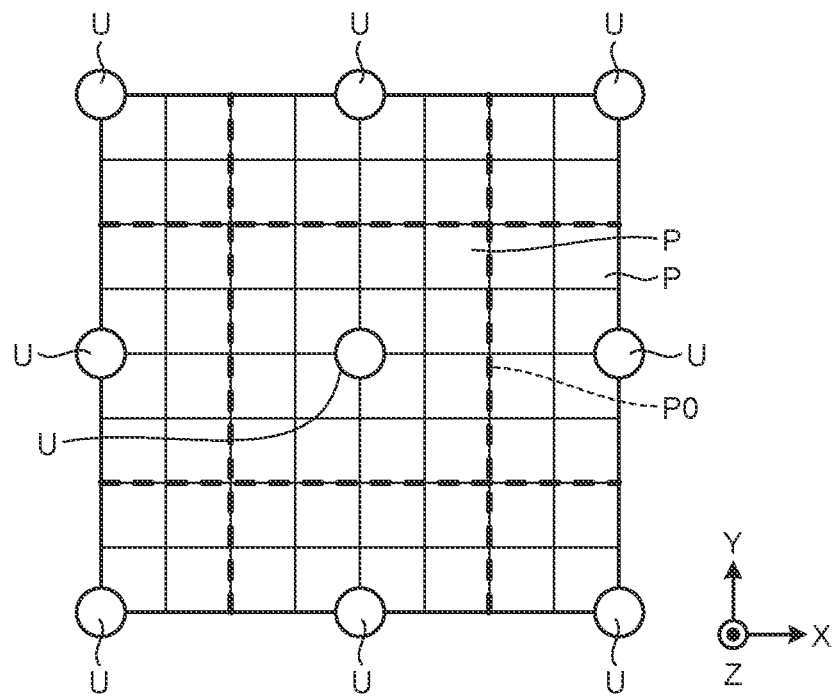
FIG. 7 is a schematic diagram illustrating exemplary positions where inorganic light emitters are provided.

FIG. 7 is a schematic diagram illustrating exemplary positions where the inorganic light emitters are provided. FIG. 7 illustrates the positions of the inorganic light emitters U with respect to the pixels P when viewed from the direction Z. The inorganic light emitters U are provided one each for a plurality of the pixels P, in other words, are provided one for each pixel group P0 constituted by a plurality of the pixels P. In the present embodiment, the pixel group P0 includes 16 of the pixels P arranged in four rows and four columns. The inorganic light emitting element LED has a large spreading angle of emitted light of, for example, approximately 80 degrees, so that each of the inorganic light emitters U can emit the light to a plurality of the pixels P in this manner. However, the number of the pixels P included in the pixel group P0 is not limited to this example, and may be any number. The inorganic light emitters U are not limited to being provided one each for a plurality of the pixels P, and may be provided, for example, one for each of the pixels P.

In FIG. 7, for convenience of explanation, the inorganic light emitter U is drawn in a large size, and therefore, a portion of the inorganic light emitter U overlaps the pixel P when viewed from the direction Z. However, in reality, the inorganic light emitter U preferably does not overlap the pixel P when viewed from the direction Z. In other words, the inorganic light emitter U is preferably provided outside a region provided with the pixel P when viewed from the direction Z, and is, for example, preferably provided in a position overlapping the black matrix BM illustrated in FIG. 6, or in a portion where the colors of the color filters overlap. In other words, the inorganic light emitter U is preferably provided between the pixel P and the pixel P when viewed from the direction Z. The pixel P and the region provided with the pixel P each refer to the color filters 26 included in the pixel P. Accordingly, the term "between the pixel P and the pixel P" can be said to be between the color filter 26 and the color filter 26. In addition, the inorganic light emitter U is preferably provided, for example, in a central portion of a region occupied by the pixel group P0 when viewed from the direction Z. However, the position provided with the inorganic light emitter U is not limited to those described above, and may be any position, and may, for example, overlap the color filter 26 of the pixel P when viewed from the direction Z.

Figure 8:
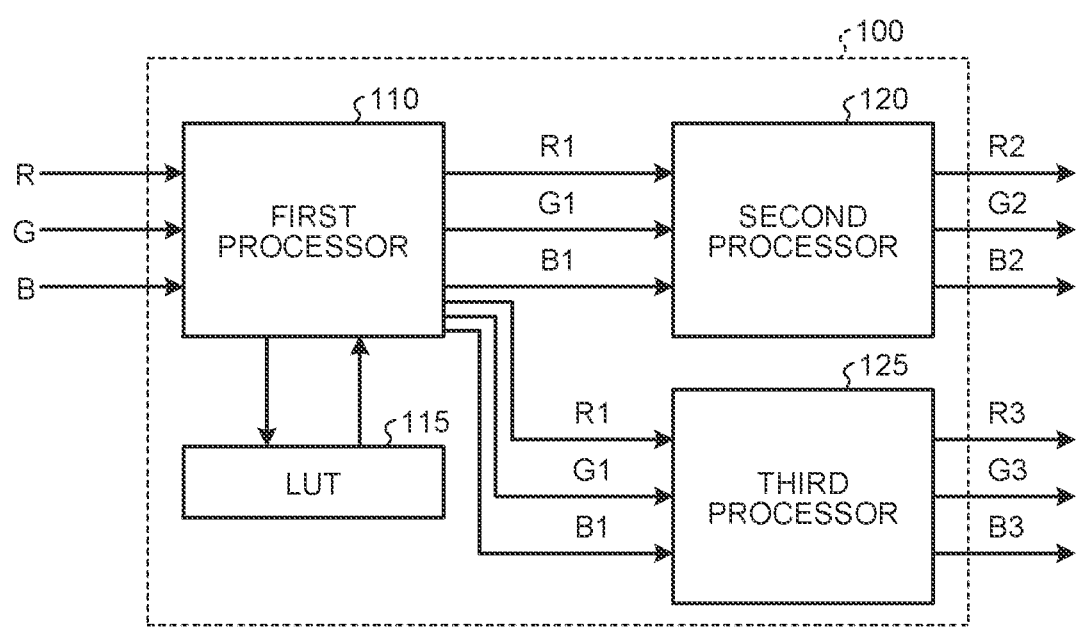
FIG. 8 is a block diagram illustrating a configuration example of a signal processing circuit according to the embodiment.

The display device 1 has the configuration as described above. The following describes a method in which the display device 1 controls the gradation value for each of the divided pixels P2. FIG. 8 is a block diagram illustrating a configuration example of the signal processing circuit according to the present embodiment. As illustrated in FIG. 8, the signal processing circuit 100 includes a first processor 110, a second processor 120, a third processor 125, and a lookup table (LUT) 115. The first processor 110 identifies gradation values (R1, G1, B1) of the respective sub-pixels P1 included in the pixel P based on gradation values (R, G, B) for respective received RGB colors (red, blue, and green in the present embodiment). The gradation value R1 is the gradation value of the sub-pixel P1R. The gradation value G1 is the gradation value of the sub-pixel P1G. The gradation value B1 is the gradation value of the sub-pixel P1B. The LUT 115 is table data including information representing the gradation values (R1, G1, B1) of the sub-pixels P1 set in advance for the gradation values (R, G, B). The first processor 110 identifies the gradation values (R1, G1, B1) corresponding to the received gradation values (R, G, B) with reference to the LUT 115.

The second processor 120 acquires the gradation values (R1, G1, B1) of the sub-pixel P1 from the first processor 110. The second processor 120 outputs area coverage modulation signals (R2, G2, B2) for each of the divided pixels corresponding to the gradation values (R1, G1, B1) of the sub-pixel P1 to the signal output circuit 70. The area coverage modulation signal (R2) is a signal for indicating which of the divided pixels P2R1, P2R2, and P2R3 is to be driven. The area coverage modulation signal (G2) is a signal for indicating which of the divided pixels P2G1, P2G2, and P2G3 is to be driven. The area coverage modulation signal (B2) is a signal for indicating which of the divided pixels P2B1, P2B2, and P2B3 is to be driven. The signal output circuit 70 outputs the video signals based on the area coverage modulation signals (R2, G2, B2) to the respective divided pixels P2 to express gradations by the area coverage modulation. The term "the divided pixel P2 is driven" means that the divided pixel P2 is enabled to emit the light L1, more specifically, indicates that a potential difference is generated between the reflective electrode 20 and the counter electrode 24 of the divided pixel P2 to generate an electric field in the liquid crystal layer 28.

The third processor 125 acquires the gradation values (R1, G1, B1) of the sub-pixel P1 from the first processor 110. The third processor 125 outputs light emission control signals (R3, G3, B3) corresponding to the gradation values (R1, G1, B1) of the sub-pixel P1 to the inorganic light emitter control circuit 130. The light emission control signal (R3) is a signal for indicating whether to drive the inorganic light emitting element $LED_R$, that is, whether to cause the inorganic light emitting element $LED_R$ to emit light. The light emission control signal (G3) is a signal for indicating whether to drive the inorganic light emitting element $LED_G$, that is, whether to cause the inorganic light emitting element $LED_G$ to emit light. The light emission control signal (B3) is a signal for indicating whether to drive the inorganic light emitting element $LED_B$, that is, whether to cause the inorganic light emitting element $LED_B$ to emit light. The inorganic light emitter control circuit 130 controls the light emission of the inorganic light emitting elements $LED_R$, $LED_G$, and $LED_B$ based on the light emission control signals (R3, G3, B3). This operation allows the pixel P to express the gradations by adding the light emission of the inorganic light emitting elements $LED_R$, $LED_G$, and $LED_B$ to the area coverage modulation based on the area coverage modulation signals (R2, G2, B2).

Figure 9:
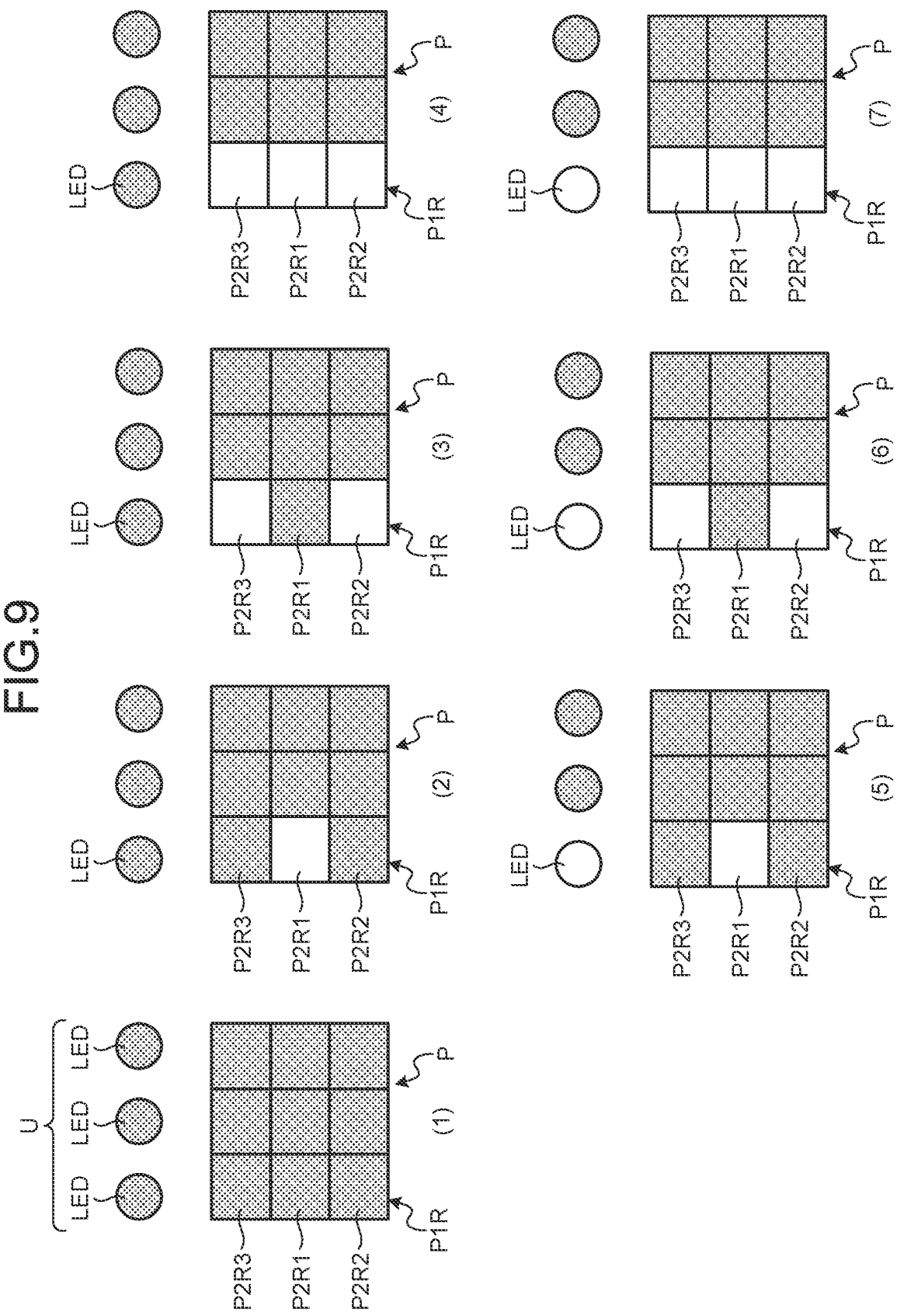
FIG. 9 is a schematic diagram illustrating exemplary gradation expressions.

The following describes an example of the gradation expression obtained by adding the light emitting elements LED. FIG. 9 is a schematic diagram illustrating the example of the gradation expression. FIG. 9 explains the gradation expression of the sub-pixel P1R as an example. As illustrated in the example of FIG. 9, when the sub-pixel P1R expresses the gradation of red, seven gradation expressions of (1) to (7) can be achieved. In the case of (1), the signal processing circuit 100 sets the area coverage modulation signal (R2) to be a signal indicating not to drive the divided pixels P2R1, P2R2, and P2R3 of the sub-pixel P1R, and sets the light emission control signal (R3) to be a signal indicating not to cause the inorganic light emitting element $LED_R$ to emit light. Accordingly, in the case of (1), the signal output circuit 70 does not drive the divided pixels P2R1, P2R2, and P2R3, and the inorganic light emitter control circuit 130 does not cause the inorganic light emitting element $LED_R$ to emit light. As a result, in the case of (1), for example, the gradation value of red is set to zero. Even if the inorganic light emitting element LED emits light in the case of (1), the divided pixels P2R1, P2R2, and P2R3 are not driven, that is, the liquid crystals do not move in the normally black state, so that the light emission of the inorganic light emitting element LED does not contribute to the gradation.

In the case of (2), the signal processing circuit 100 sets the area coverage modulation signal (R2) to be a signal indicating to drive only the divided pixel P2R1 of the sub-pixel P1R, and sets the light emission control signal (R3) to be a signal indicating not to cause the inorganic light emitting element $LED_R$ to emit light. Accordingly, in the case of (2), the signal output circuit 70 drives the divided pixel P2R1, and the inorganic light emitter control circuit 130 does not cause the inorganic light emitting element $LED_R$ to emit light. As a result, in the case of (2), only the divided pixel P2R1 emits the light L1, and, for example, the gradation value of red is one, which is larger than that of (1). In the case of (3), the signal processing circuit 100 sets the area coverage modulation signal (R2) to be a signal indicating to drive the divided pixels P2R2 and P2R3 of the sub-pixel P1R, and sets the light emission control signal (R3) to be a signal indicating not to cause the inorganic light emitting element $LED_R$ to emit light. Accordingly, in the case of (3), the signal output circuit 70 drives the divided pixels P2R2 and P2R3, and the inorganic light emitter control circuit 130 does not cause the inorganic light emitting element $LED_R$ to emit light. As a result, in the case of (3), the divided pixels P2R2 and P2R3 emit the light L1 and, for example, the gradation value of red is two, which is larger than that of (2). In the case of (4), the signal processing circuit 100 sets the area coverage modulation signal (R2) to be a signal indicating to drive the divided pixels P2R1, P2R2, and P2R3 of the sub-pixel P1R, and sets the light emission control signal (R3) to be a signal indicating not to cause the inorganic light emitting element $LED_R$ to emit light. Accordingly, in the case of (4), the signal output circuit 70 drives the divided pixels P2R1, P2R2, and P2R3, and the inorganic light emitter control circuit 130 does not cause the inorganic light emitting element LED$_R$ to emit light. As a result, in the case of (4), only the divided pixels P2R1, P2R2, and P2R3 emit the light L1, and, for example, the gradation value of red is three, which is larger than that of (3).

As described above, the control through the area coverage modulation is control to change the gradation value by changing the area for emitting the light L1 by selecting the divided pixels to be driven from among the divided pixels P2R1, P2R2, and P2R3. In the present embodiment, the number of gradation values is increased by switching between emission and non-emission of the inorganic light emitting element LED$_R$.

For example, in the case of (5), the signal processing circuit 100 sets the area coverage modulation signal (R2) to be a signal indicating to drive only the divided pixel P2R1 of the sub-pixel P1R, and sets the light emission control signal (R3) to be a signal indicating to cause the inorganic light emitting element LED$_R$ to emit light. Accordingly, in the case of (5), the signal output circuit 70 drives the divided pixel P2R1, and the inorganic light emitter control circuit 130 causes the inorganic light emitting element LED$_R$ to emit light. As a result, in the case of (5), the gradation value is higher than that in the case of (2) by an amount of the light emitted from the inorganic light emitting element LED$_R$, and, for example, the gradation value of red is four. The gradation value in the case of (5) only needs to differ from the gradation values in the cases of (1) to (4). For example, any magnitude relations may be established with the gradation values in the cases of (3) and (4). In the case of (6), the signal processing circuit 100 sets the area coverage modulation signal (R2) to be a signal indicating to drive the divided pixels P2R2 and P2R3 of the sub-pixel P1R, and sets the light emission control signal (R3) to be a signal indicating to cause the inorganic light emitting element LED$_R$ to emit light. Accordingly, in the case of (6), the signal output circuit 70 drives the divided pixels P2R2 and P2R3, and the inorganic light emitter control circuit 130 causes the inorganic light emitting element LED$_R$ to emit light. As a result, in the case of (6), the gradation value is higher than that in the case of (3) by an amount of the light emitted from the inorganic light emitting element LED$_R$, and, for example, the gradation value of red is five. The gradation value in the case of (6) only needs to differ from the gradation values in the cases of (1) to (5). For example, any magnitude relation may be established with the gradation value in the case of (4). In the case of (7), the signal processing circuit 100 sets the area coverage modulation signal (R2) to be a signal indicating to drive the divided pixels P2R1, P2R2, and P2R3 of the sub-pixel P1R, and sets the light emission control signal (R3) to be a signal indicating to cause the inorganic light emitting element LED$_R$ to emit light. Accordingly, in the case of (7), the signal output circuit 70 drives the divided pixels P2R1, P2R2, and P2R3, and the inorganic light emitter control circuit 130 causes the inorganic light emitting element LED$_R$ to emit light. As a result, in the case of (7), the gradation value is higher than that in the case of (4) by an amount of the light emitted from the inorganic light emitting element LED$_R$, and, for example, the gradation value of red is six. The gradation value in the case of (7) is higher than those in the cases of (1) to (6).

As described above, the display device 1 according to the present embodiment controls the divided pixel P2 driven by the area coverage modulation signal, and controls the light emission of the inorganic light emitting element LED using the light emission control signal. Through these operations, the display device 1 switches the gradation of the displayed color. More specifically, the number of expressible gradations can be a number obtained by multiplying the number of gradations represented by the area coverage modulation signal by the number of gradations expressible by the inorganic light emitting element LED. Thus, the number of expressible gradations can be increased.

In the example of FIG. 9, seven gradation values are expressible. However, the number of expressible gradation values varies depending on the number of the divided pixels P2 included in the sub-pixel P1, the number of the inorganic light emitting elements LED, and the colors to be expressed. For example, when the number of the divided pixels P2 included in the sub-pixel P1 increases to four from that of the example in FIG. 9, 16 gradation values are expressible. When the number of the drivable inorganic light emitting elements LED$_R$ increases to two from that of the example in FIG. 9, 16 gradation values are expressible. When complementary colors such as yellow, cyan, and magenta are expressed, two of the primary colors are combined. Therefore, 16 gradation values are expressible. That is, including the fact that the inorganic light emitting element LED in the normally black state (black display) does not contribute to the gradation, a number TR of gradation values of red is represented as Expression (1); a number TG of gradation values of green is represented as Expression (2); a number TB of gradation values of blue is represented as Expression (3); a number TY of gradation values of yellow is represented as Expression (4); a number TC of gradation values of cyan is represented as Expression (5); and a number TM of gradation values of magenta is represented as Expression (6). In the expressions below, n denotes the number of gradations expressible by the area coverage modulation of the divided pixels P2 included in each of the sub-pixels P1; i denotes the number of gradations expressible by the light emission of the inorganic light emitting element LED$_R$; j denotes the number of gradations expressible by the light emission of the inorganic light emitting element LED$_G$; and k denotes the number of gradations expressible by the light emission of the inorganic light emitting element LED$_B$. The numbers n, i, j, and k are integers.

$$TR = i \cdot n - 1 \tag{1}$$

$$TG = j \cdot n - 1 \tag{2}$$

$$TB = k \cdot n - 1 \tag{3}$$

$$TY = i \cdot i \cdot j \cdot n - 2 \tag{4}$$

$$TC = i \cdot k \cdot n - 2 \tag{5}$$

$$TM = j \cdot k \cdot n - 2 \tag{6}$$

Figure 10:
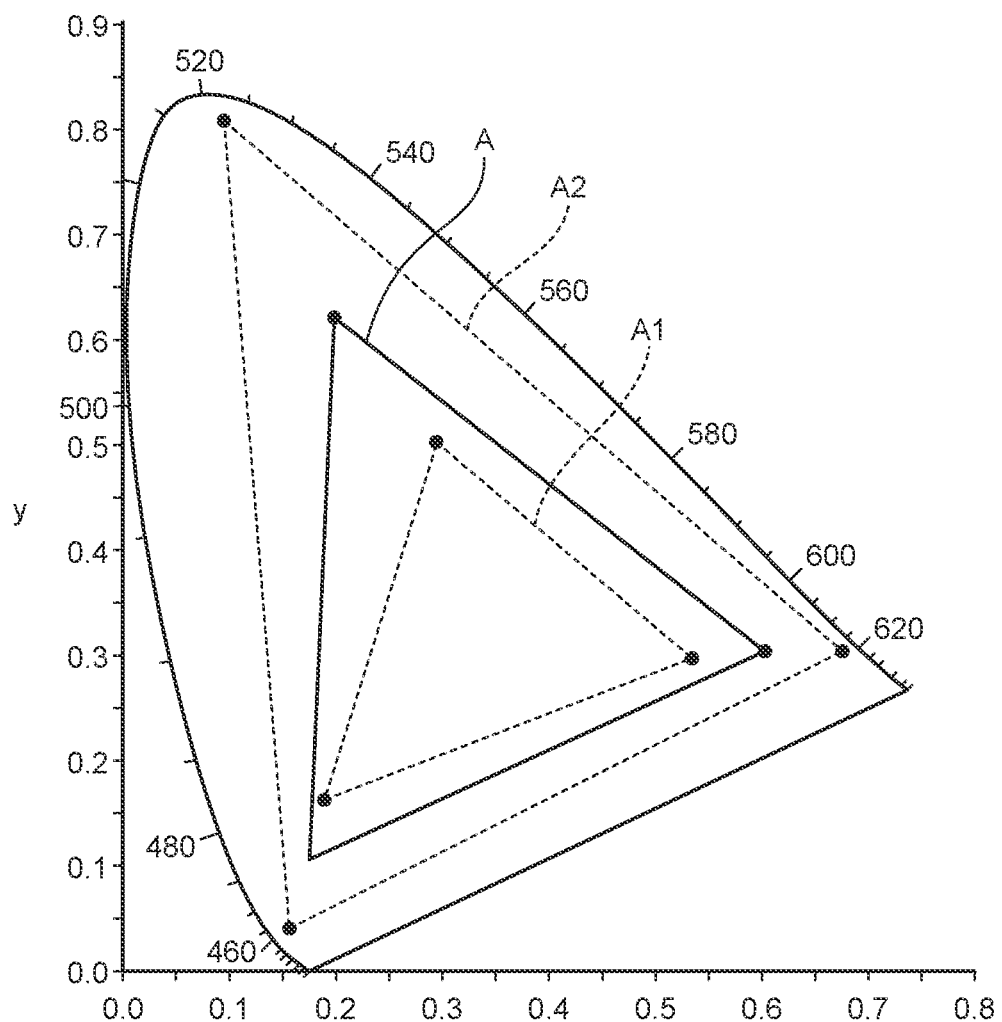
FIG. 10 is a diagram explaining color gradation expression in a color space.

FIG. 10 is a diagram explaining color gradation expression in a color space. FIG. 10 illustrates an XY chromaticity diagram developed by the International Commission on Illumination (CIE). In FIG. 10, the number of expressible gradations increases as the area increases. A region A1 of FIG. 10 illustrates a color space that can be expressed only by the control through the area coverage modulation of the divided pixels P2. A region A2 of FIG. 10 illustrates a color space that can be expressed by the light emission of the inorganic light emitting elements LED. Since the display device 1 according to the present embodiment performs the control through the area coverage modulation of the divided pixels P2, and also controls the light emission of the inorganic light emitting elements LED, the expressible color space is obtained as illustrated as a region A. The region A is narrower than the region A2, but wider than the region A1. Therefore, it is found that, according to the present embodiment, by providing the inorganic light emitting elements LED, the expressible color space is made wider and the number of expressible gradations is made larger than in the case of the control through the area coverage modulation of the divided pixels P2.

In the reflective MIP display device, since the latch unit 57 is provided for each of the divided pixels P2, the number of the arrangeable divided pixels P2 is also limited. Accordingly, the number of gradations of colors in the MIP display device may be insufficient, so that the number of gradations of colors is desired to be increased. In contrast, the display device 1 according to the present embodiment includes the divided pixels P2 and the inorganic light emitters U. The divided pixel P2 includes the reflective electrode 20, the counter electrode 24 provided so as to face the reflective electrode 20, the color filter 26 provided on a side (upper side) of the counter electrode 24 opposite to a side thereof facing the reflective electrode 20, and the holding unit (latch unit 57) for holding the potential corresponding to the gradation expression. The inorganic light emitter U is provided on the counter electrode 24 side of the color filter 26, and emits the light. The display device 1 according to the present embodiment can increase the number of gradations of the MIP display device by causing the inorganic light emitter U to emit the light. By providing the inorganic light emitter U, for example, warm colors and yellow can be suitably displayed. By providing the inorganic light emitter U on the counter electrode 24 side of the color filter 26, the dimming layer 30 located on the upper side of the color filter 26 can serve as an antireflection film against not only the light L1 from the reflective electrode 20, but also the light from the inorganic light emitter U. Accordingly, the display device 1 can have a simplified structure.

The liquid crystal layer 28 is provided between the counter electrode 24 and the color filter 26. At least a portion of the inorganic light emitter U is provided in the liquid crystal layer 28. By providing at least a portion of the inorganic light emitter U in the liquid crystal layer 28, the light from the inorganic light emitter U can be appropriately emitted through the liquid crystal layer 28, and the number of gradations of the MIP display device can be appropriately increased.

The inorganic light emitter U includes the light-transmitting protective film 16 that covers the portion of the inorganic light emitting element LED provided in the liquid crystal layer 28. By covering the inorganic light emitting element LED with the protective film 16, the inorganic light emitting element LED can be restrained from directly contacting the liquid crystal layer 28.

A plurality of the divided pixels P2 including the color filters 26 for the same color constitute each of the sub-pixels P1. A plurality of the sub-pixels P1 including the color filters 26 for different colors constitute each of the pixels P. The pixels P are arranged in a matrix having a row-column configuration. In the display device 1 according to the present embodiment, as described above, the pixel P is constituted by the sub-pixels P1 for displaying different colors, and the sub-pixel P1 is constituted by the divided pixels P2 for displaying the same color. Accordingly, the display device 1 according to the present embodiment can appropriately control the gradation through the area coverage modulation of the divided pixels P2, and can appropriately increase the number of gradations of the MIP display device in combination with the light emission control of the inorganic light emitter U.

The inorganic light emitters U are provided one each for a plurality of the pixels P. In the display device 1 according to the present embodiment, the inorganic light emitters U are provided one each for a plurality of the pixels P, whereby the number of the inorganic light emitters U is restrained from excessively increasing, and power consumption can be restrained from being increased by lighting of the inorganic light emitters U.

The inorganic light emitter U includes the inorganic light emitting elements LED that emit the light in colors different from one another. In this manner, the inorganic light emitting elements LED are provided that emit the light in the different colors, whereby the number of gradations of each of the colors can be appropriately increased.

The display device 1 further includes an inorganic light emitter controller (inorganic light emitter control circuit 130) for controlling the emission of the light of the inorganic light emitter U. The inorganic light emitter controller switches the gradation expressed by the divided pixel P2 by switching between emission and non-emission of the inorganic light emitter U. The display device 1 can appropriately increase the number of gradations of the MIP display device by switching the drive of the divided pixels P2 using a divided pixel controller (signal output circuit 70), and switching the light emission of the inorganic light emitters U using the inorganic light emitter controller.

Figure 11:
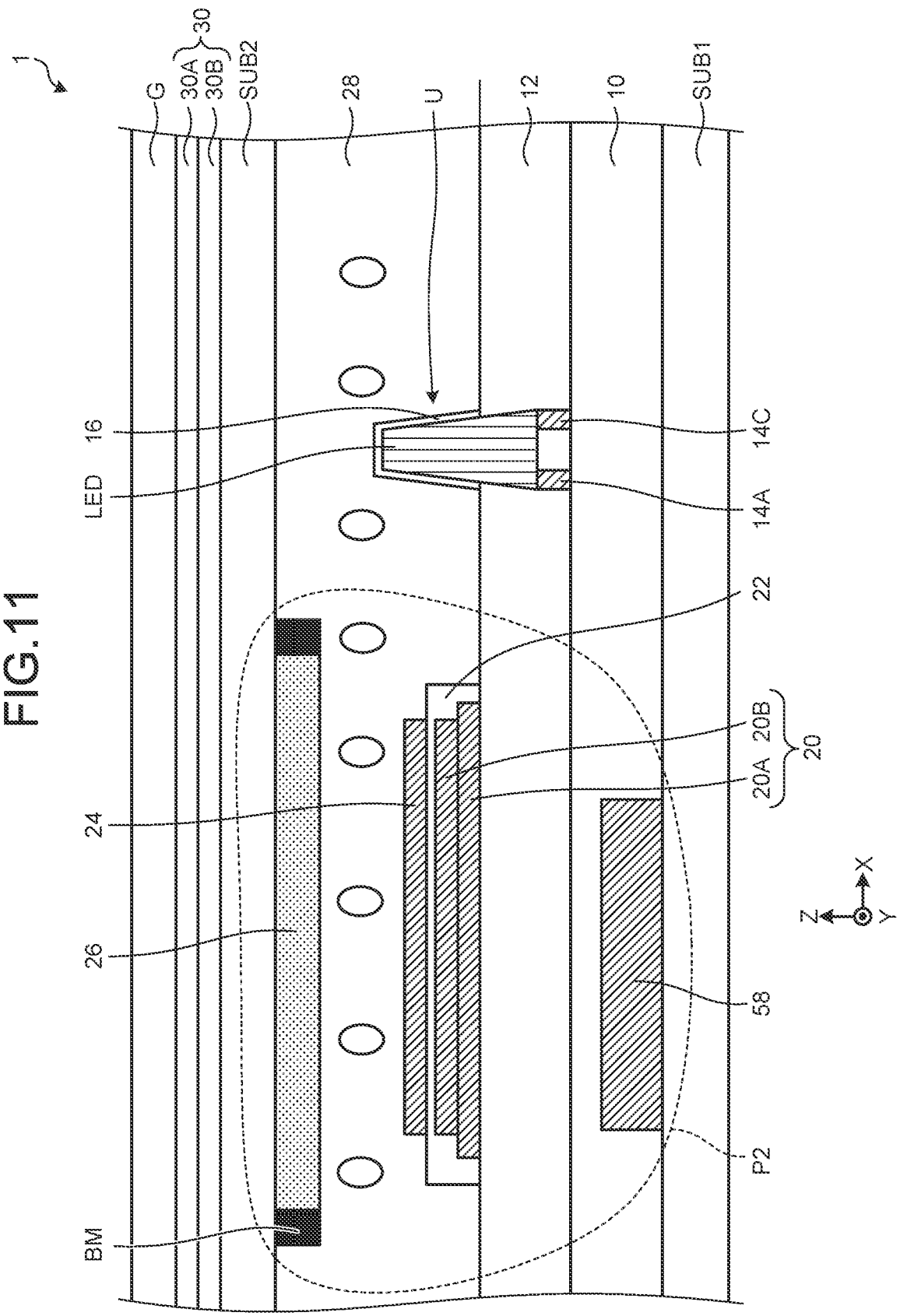
FIG. 11 is a schematic sectional view of the display device according to another example of the embodiment.

In the present embodiment, the inorganic light emitter U includes the inorganic light emitting elements LED that emit the light in the different colors. However, the inorganic light emitter U may include the inorganic light emitting element LED that emits light in one color. FIG. 11 is a schematic sectional view of the display device according to another example of the present embodiment. As illustrated in FIG. 11, the inorganic light emitter U may include one of the inorganic light emitting elements LED, and may emit only light in one color. In this case, the inorganic light emitting element LED emits, for example, the white light La. However, the color of the light in the case of emitting only light in one color is not limited to white, and may be any color. The inorganic light emitter U may include a plurality of the inorganic light emitting elements LED that emit light in the same color.

When the inorganic light emitter U emits the white light, a number T of gradation values expressible by the display device 1 is given by Expression (7) below, where 1 denotes a gradation value that can be expressed by the light emission of the inorganic light emitter U, and 1 is an integer. In this case, the number of gradation values is the same for each color.

$$T = l \cdot n \qquad (7)$$

Figure 12:
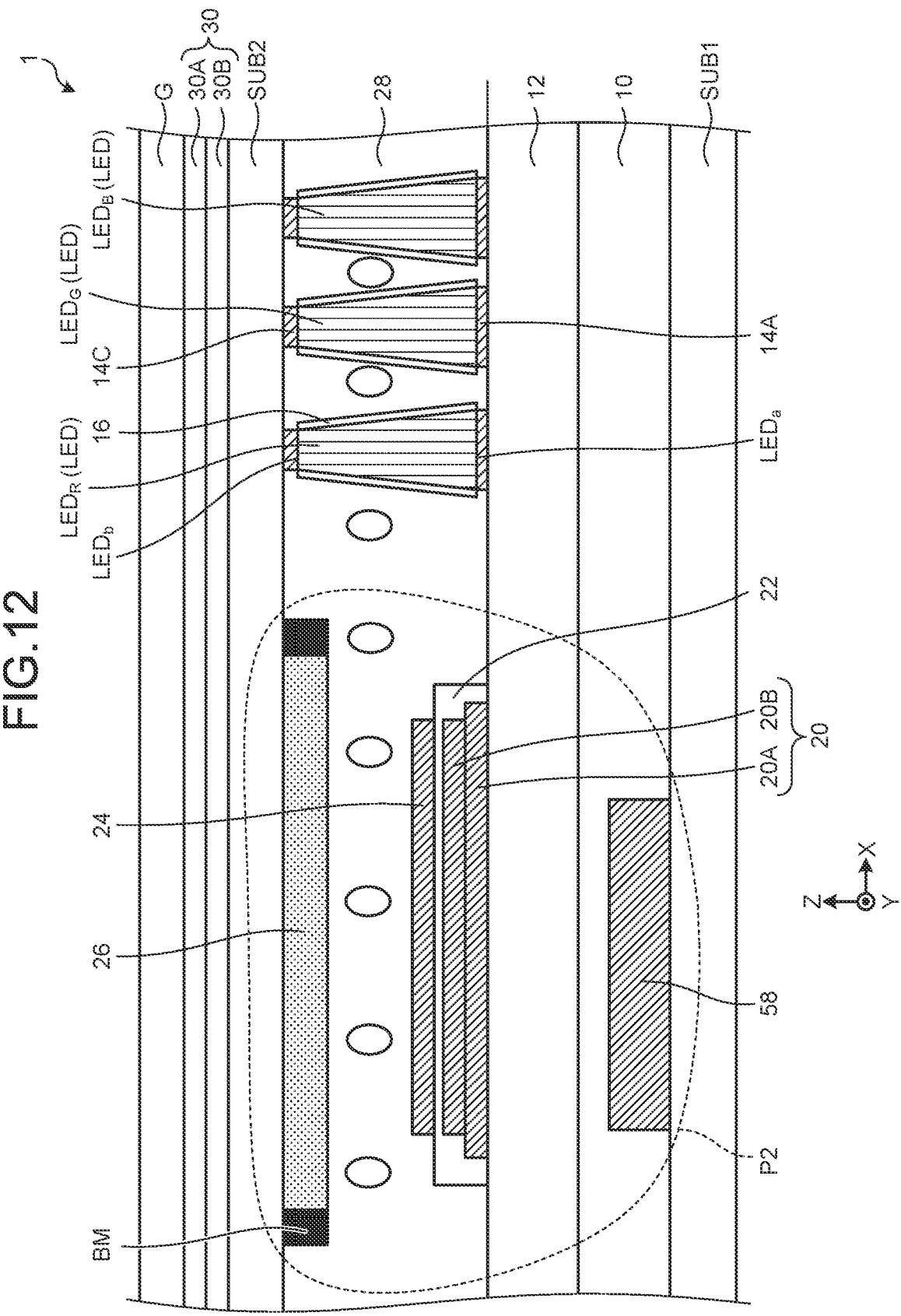
FIG. 12 is a schematic sectional view of the display device according to still another example of the embodiment.

In the present embodiment, as illustrated in FIG. 6, the inorganic light emitting element LED has the flip chip structure that is coupled to the anode electrode 14A and the cathode electrode 14C on the same surface side. However, the inorganic light emitting element LED is not limited to the flip chip structure, and may have a vertical coupling structure that is coupled to the anode electrode 14A and the cathode electrode 14C on different surface sides. FIG. 12 is a schematic sectional view of the display device according to still another example of the present embodiment. As illustrated in FIG. 12, in the case of the vertical coupling structure, for example, the anode electrode 14A is provided on the insulating layer 12. The lower surface LEDa of the inorganic light emitting element LED is provided on the anode electrode 14A, and is coupled to the anode electrode 14A. The upper surface LEDb of the inorganic light emitting element LED is coupled to the cathode electrode 14C provided on the upper side of the inorganic light emitting element LED. In the example of FIG. 12, the whole portion from the lower surface LEDa to the upper surface LEDb of the inorganic light emitting element LED is provided in the liquid crystal layer 28. However, only a portion may be provided in the liquid crystal layer 28 in the same manner as in FIG. 6. In FIG. 12, a portion of the inorganic light emitting element LED is located on the upper side of the lower surface of the color filter 26. However, it can be said that at least a portion of the inorganic light emitting element LED is located on the lower side (reflective electrode 20 side) of the lower surface of the color filter 26. Therefore, also in FIG. 12, the inorganic light emitter U (inorganic light emitting element LED) can be said to be provided on the lower side (on the counter electrode 24 side) of the color filter 26. The positions of the inorganic light emitting element LED, the anode electrode 14A, and the cathode electrode 14C in FIG. 12 are an example of the vertical coupling structure, and are not limited to the positions illustrated in FIG. 12.

Figure 13:
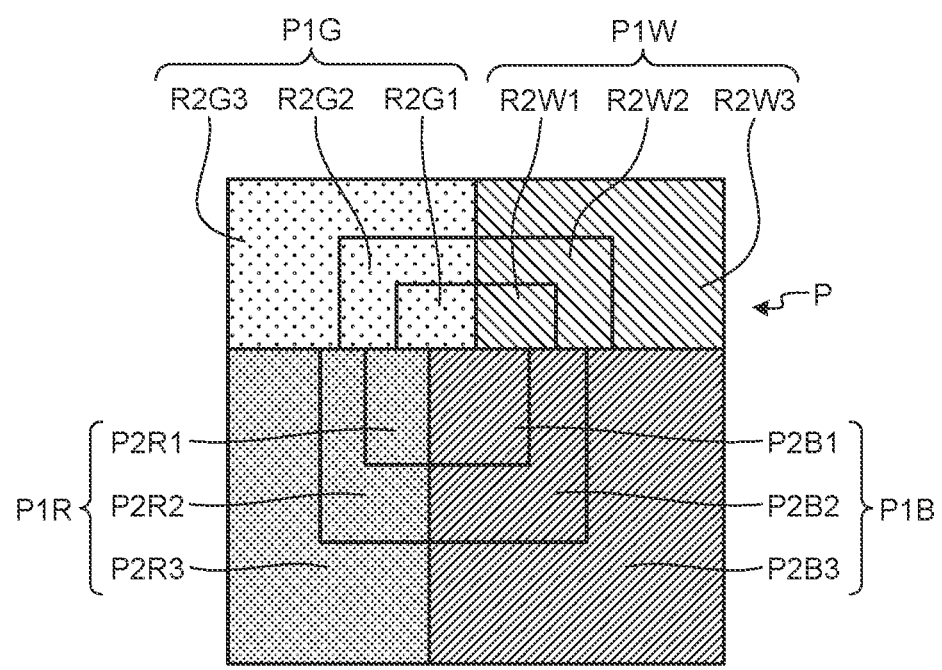
FIG. 13 is a schematic diagram illustrating an exemplary pixel array according to still another example of the embodiment.

In the present embodiment, each of the pixels P includes three of the sub-pixels P1. However, the number of the sub-pixels P1 included in the pixel P is not limited to three, and may be, for example, four. FIG. 13 is a schematic diagram illustrating an example of a pixel array according to the other example of the present embodiment. FIG. 13 illustrates the example of the pixel array when the number of the sub-pixels P1 included in the pixel P is four. In FIG. 13, the pixel P includes sub-pixels P1G, P1W, P1R, and P1B. The sub-pixels P1G, P1W, P1R, and P1B are arranged in two rows and two columns, and have different areas from one another. The sub-pixel P1W displays a color different from those of the sub-pixels P1G, P1R, and P1B, and herein displays white, for example. The sub-pixel P1W includes the divided pixels P2 in the same manner as the other sub-pixels P1, and herein includes divided pixels P2W1, P2W2, and P2W3. The divided pixels P2W1, P2W2, and P2W3 display the same color as one another, and herein display white. However, the color displayed by the sub-pixel P1W (divided pixels P2W1, P2W2, and P2W3) is not limited to white, and may be any color such as bluish green. The arrangement order and the area ratio of the sub-pixels P1G, P1W, P1R, and P1B are not limited to the example of FIG. 13, and are optional. The number of the sub-pixels P1 included in the pixel P is not limited to three or four, and the number of the divided pixels P2 included in the sub-pixel P1 is also not limited to three.

The display device 1 according to the present embodiment may be switched between an inorganic light emitter drive mode of causing the inorganic light emitter U to emit light and an inorganic light emitter stop mode of causing the inorganic light emitter U not to emit light, for example, according to the intensity of the external light L. The inorganic light emitter drive mode is a mode of controlling whether to cause the inorganic light emitter U to emit light or stop emitting light as described above according to the received gradations. The inorganic light emitter stop mode is a mode in which the inorganic light emitter U always stops emitting light and the gradation is switched only through the area coverage modulation. For example, the display device 1 switches to the inorganic light emitter drive mode when the intensity of the external light L is equal to or lower than a predetermined value, and switches to the inorganic light emitter stop mode when the intensity of the external light L is higher than the predetermined value. In this case, the display device 1 conducts a reverse bias current through at least a part of the inorganic light emitting element LED to cause the inorganic light emitting element LED to serve as an optical sensor. The inorganic light emitting element LED serving as the optical sensor generates a current corresponding to the external light L. The display device 1 determines that the intensity of the external light L is higher than the predetermined value if the current value from the inorganic light emitting element LED serving as the optical sensor is larger than the threshold, or determines that the intensity of the external light L is equal to or lower than the predetermined value if the current value from the inorganic light emitting element LED serving as the optical sensor is equal to or smaller than the threshold. When the intensity of the external light L is sufficient, visibility may be ensured without increasing the gradation. Accordingly, the power consumption can be reduced by driving the inorganic light emitter U only when the intensity of the external light L is low.

Other operational advantages accruing from the aspects described in the present embodiment herein that are obvious from the description herein or that are appropriately conceivable by those skilled in the art will naturally be understood as accruing from the present disclosure.

What is claimed is:

1. A display device comprising:
a first substrate;
a second substrate;
a liquid crystal layer between the first substrate and a second substrate;
a plurality of divided pixels each comprising a reflective electrode, a counter electrode provided so as to face the reflective electrode, a color filter provided on a side of the counter electrode opposite to a side of the counter electrode facing the reflective electrode, and a holding unit configured to hold a potential corresponding to an expression of a gradation; and
an inorganic light emitter provided on the counter electrode side of the color filter, and configured to emit light, wherein
the color filter is arranged on the second substrate,
the holding unit, the reflective electrode, and the counter electrode are disposed between the first substrate and the liquid crystal layer, in a first direction perpendicular to a main surface of the first substrate, and
the inorganic light emitter is disposed between the first substrate and the liquid crystal layer, in the first direction.

2. The display device according to claim 1, wherein
the liquid crystal layer is disposed between the counter electrode and the color filter, and
at least a portion of the inorganic light emitter is provided in the liquid crystal layer.

3. The display device according to claim 2, wherein the inorganic light emitter comprises a light-transmitting protective film that covers the portion provided in the liquid crystal layer.

4. The display device according to claim 1, wherein a plurality of the divided pixels comprising the color filters for the same color constitute one sub-pixel, a plurality of the sub-pixels comprising the color filters for different colors constitute one pixel, and the pixels are arranged in a matrix having a row-column configuration.

5. The display device according to claim 4, wherein the inorganic light emitter is provided one for each of the pixels.

6. The display device according to claim 1, wherein the inorganic light emitter comprises a plurality of inorganic light emitting elements configured to emit light in colors different from one another.

7. The display device according to claim 1, wherein the inorganic light emitter comprises an inorganic light emitting element configured to emit light in one color.

8. The display device according to claim 1, further comprising an inorganic light emitter controller configured to control the emission of the light of the inorganic light emitter, wherein
- the inorganic light emitter controller is configured to switch the gradation expressed by the divided pixel by switching between emission and non-emission of the inorganic light emitter.

9. The display device according to claim 1, wherein
- the holding unit, the reflective electrode, the counter electrode, the liquid crystal layer, the color filter, and the second substrate are sequentially stacked on the first substrate, in the first direction, and
- the inorganic light emitter, the liquid crystal layer, and the second substrate are sequentially stacked on the first substrate, in the first direction.

* * * * *